United States Patent
Miller et al.

(10) Patent No.: US 10,854,305 B2
(45) Date of Patent: *Dec. 1, 2020

(54) USING A STATUS INDICATOR IN A MEMORY SUB-SYSTEM TO DETECT AN EVENT

(71) Applicant: Micron Technology, Inc., Boise, ID (US)

(72) Inventors: Michael G. Miller, Boise, ID (US); Kishore Kumar Muchherla, Fremont, CA (US); Harish R. Singidi, Fremont, CA (US); Walter Di Francesco, Avezzano (IT); Renato C. Padilla, Folsom, CA (US); Gary F. Besinga, Boise, ID (US); Violante Moschiano, Avezzano (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/820,636

(22) Filed: Mar. 16, 2020

(65) Prior Publication Data

US 2020/0219573 A1   Jul. 9, 2020

Related U.S. Application Data

(63) Continuation of application No. 16/040,382, filed on Jul. 19, 2018, now Pat. No. 10,593,412.

(51) Int. Cl.
| | | |
|---|---|---|
| *G11C 16/34* | (2006.01) | |
| *G11C 16/04* | (2006.01) | |
| *G11C 29/50* | (2006.01) | |
| *G11C 29/52* | (2006.01) | |
| *G06F 12/02* | (2006.01) | |

(52) U.S. Cl.
CPC ...... *G11C 16/3495* (2013.01); *G06F 12/0246* (2013.01); *G11C 16/04* (2013.01); *G11C 29/50004* (2013.01); *G11C 29/52* (2013.01)

(58) Field of Classification Search
CPC ........... G11C 16/3495; G11C 16/04; G11C 29/50004; G11C 29/52; G06F 12/0246
See application file for complete search history.

(56) References Cited

U.S. PATENT DOCUMENTS

| | | | |
|---|---|---|---|
| 7,057,942 B2 | 6/2006 | Suda et al. | |
| 7,522,452 B2 | 4/2009 | Shiga | |
| 8,060,684 B2 | 11/2011 | Nakanishi et al. | |
| 9,921,898 B1 * | 3/2018 | Miller | G11C 16/225 |
| 10,121,551 B1 * | 11/2018 | Miller | G06F 1/305 |
| 10,593,412 B2 * | 3/2020 | Miller | G11C 29/52 |
| 2014/0006906 A1 | 1/2014 | Shiga et al. | |
| 2018/0081414 A1 | 3/2018 | Kojima et al. | |
| 2019/0065108 A1 * | 2/2019 | Miller | G06F 3/0659 |
| 2019/0155744 A1 * | 5/2019 | Srinivasan | G06F 11/0793 |

* cited by examiner

*Primary Examiner* — Tri M Hoang
(74) *Attorney, Agent, or Firm* — Lowenstein Sandler LLP

(57) ABSTRACT

An indication of an initialization of power to a memory component can be received. In response to receiving the indication of the initialization, a last written page of a data block of the memory component can be identified. The last written page is associated with a status indicator. A determination is made of whether the status indicator is readable. Responsive to determining that the status indicator readable, it can be determined that programming of data to the data block of the memory component did complete and there is a data retention loss.

20 Claims, 5 Drawing Sheets

USING A STATUS INDICATOR IN A MEMORY SUB-SYSTEM TO DETECT AN EVENT

RELATED APPLICATIONS

This application is a continuation application of U.S. patent application Ser. No. 16/040,382, filed Jul. 19, 2018, now U.S. patent Ser. No. 10/593,412, issued Mar. 17, 2020, which is herein incorporated by reference.

TECHNICAL FIELD

Embodiments of the disclosure relate generally to memory sub-systems, and more specifically, relate to using a status indicator in a memory sub-system to detect an event.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
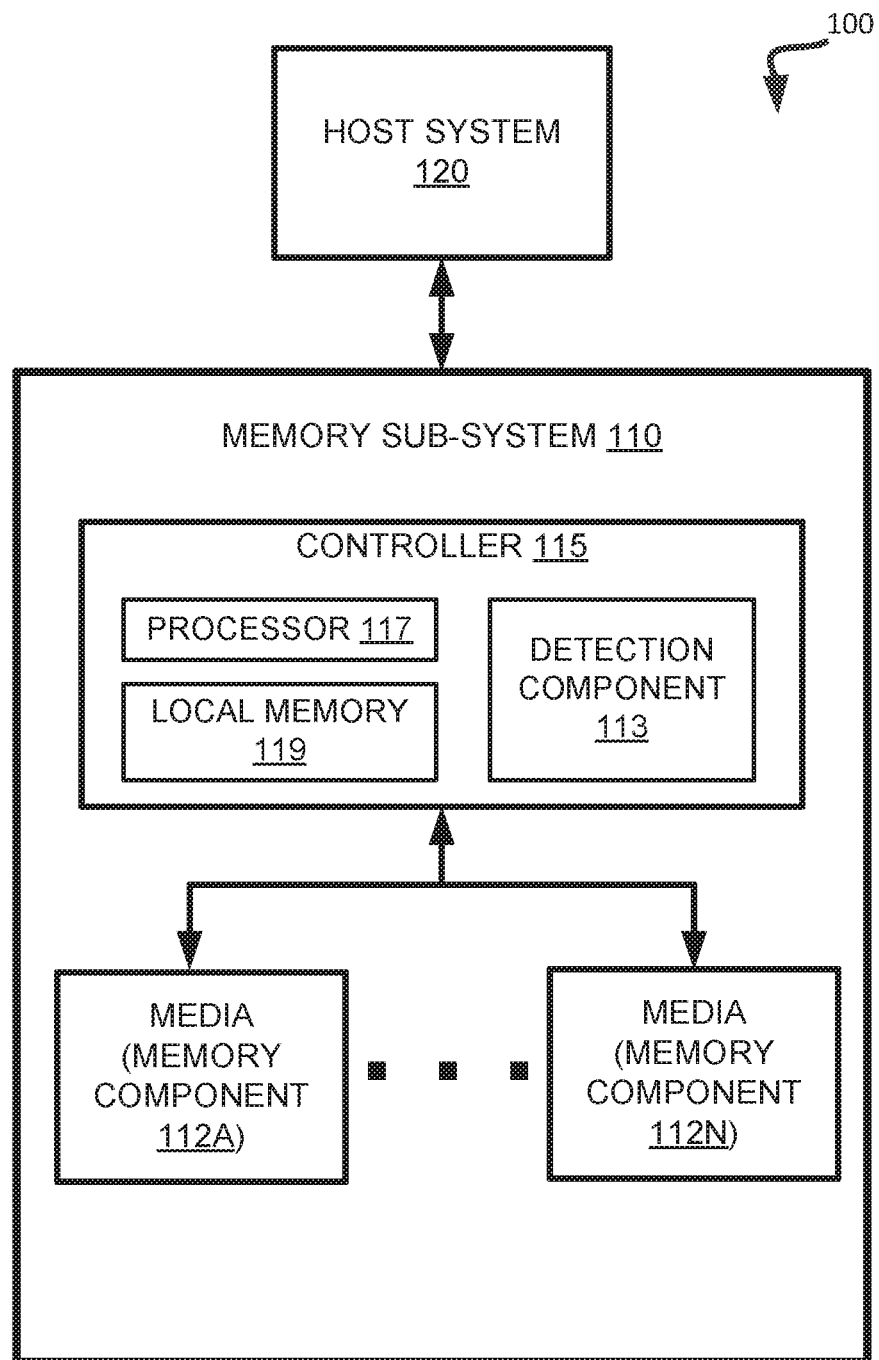
FIG. 1 illustrates an example computing environment that includes a memory sub-system in accordance with some embodiments of the present disclosure.

Aspects of the present disclosure are directed to using a status indicator in a memory sub-system to detect an event. A memory sub-system is also hereinafter referred to as a "memory device". An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can store the data at a memory component included in the memory sub-system. The memory component can include memory cells. Each of the memory cells can store one or more bits of binary data corresponding to the data received from the host system. The memory component can include a multi-level cell (MLC), a triple-level cell (TLC), or a quad-level cell (QLC) memory. In TLC memory, each memory cell can store three bits of data. In QLC memory, each memory cell can store four bits of data. For example, in a QLC memory, a memory cell can store four bits of data (e.g., 1111, 0000, 1101, etc.) corresponding to data received from the host system. Each bit of a memory cell is stored at a different portion (also referred to as "page" hereafter) of the memory cell. A memory cell of the QLC memory can have a total of four pages. For example, the memory cell can include a lower page (LP), an upper page (UP), an extra page (XP) and a top page (TP), where each page stores a bit of data. For example, a bit can be represented by each of the four pages of the memory cell.

The memory cells can be grouped as data blocks that can refer to a unit of the memory component used to store data. There can be numerous memory components (e.g., tens, hundreds, etc.) in a memory sub-system, and each memory component can include a large amount (e.g., thousands) of data blocks. For example, when programming the data to the QLC memory, a superblock of four data blocks on each of a number of memory components can be programmed at a time. That is, a superblock can refer to a certain number of data blocks that are programmed at the same time on each memory component. A conventional memory sub-system can include sixteen QLC memory components where four data blocks are programmed at the same time. Thus, a superblock can include sixty-four data blocks (e.g., four data blocks on each of the sixteen memory components).

Generally, the conventional memory sub-system can receive a request from a host system to perform a programming operation to store data at the QLC memory. The memory sub-system can then perform a two-pass programming operation on the memory cells. During a first programming pass of the two-pass programming operation, the controller can program or write data to three portions of a memory cell of the memory sub-system. For example, the controller can program (e.g., write data to) the LP, UP and XP of the memory cell. At the end of the first pass of the two-pass programming operation, there can be two distributions of levels of programmed and un-programmed portions of a memory cell. During a second programming pass of the two-pass programming operation, the memory sub-system can program or write data to the last portion of the memory cell of the memory sub-system. At the end of the second pass of the two-pass programming operation, there can be a required number of levels of programmed portions of the memory cells in the memory component.

In a flash memory, the memory components can suffer from data retention loss. Data retention loss can refer to a bit error rate of data exceeding a threshold. Data retention loss can occur in various ways. For example, memory cells that are adjacent or proximate to each other can be coupled so that data provided to a first memory cell can alter data previously stored at a second memory cell that is adjacent or proximate to the first memory cell. For example, the programming of the LP, UP, and XP of the first memory cell can alter the data stored at the XP of the second memory cell. The alteration can be a result of a voltage that is applied to program the first memory cell also impacting the data stored at the second memory cell. Such an alteration of the XP of the second memory cell can result in an error of the data stored at the XP of the second memory cell. Accordingly, the programming operations performed on the first memory cell during the first programming pass can increase an error rate for data previously stored at a second memory cell that is adjacent or proximate to the first memory cell.

In conventional systems, determining the difference between data affected by data retention loss and data affected by a prior loss of power (e.g., an asynchronous power loss) during programming of data to the memory component can be difficult. This is because data reads can fail either when the data is affected by a data retention loss or when the data is affected by a prior loss of power. There is a conventional mechanism to attempt to determine whether a data retention loss or prior loss of power scenario is present. However, as described below, such a conventional mechanism can be costly in terms of performance of the memory sub-system, and the mechanism can be inaccurate in its determination of either scenario. Incorrectly determining that data retention loss occurs can be detrimental because the handling of such a scenario can include significant recovery procedures that recover a large amount (e.g., all) of data written to one or more data blocks (e.g., an entire superblock can be rewritten) that is slow and resource intensive, whereas the handling of a prior power loss is faster and less resource intensive by just recovering a portion of the data written to the one or more data blocks. The data retention loss handling procedure can be referred to as "folding" herein, and the asynchronous power loss handling procedure can be referred to as "program continuation" herein.

To make the determination between a data retention loss and an asynchronous power loss in a conventional memory sub-system, the memory sub-system can search for a last written page of open data blocks of a memory component. An open data block can be identified by an indicator that specifies whether the data block is open or closed and the data block is open when a two-pass programming operation has not completed on the data block. A data block can be considered to be closed when the two-pass programming operation has completed on the data block. A margin read can be performed on the last written page by moving a read level position of a highest level to a higher placement (e.g., a plot offset). The read level can be moved by offsetting a read voltage level by a certain amount of millivolts. If the read is successful, then the last written page is a normally written page (e.g., a page that is not affected by data retention loss or an asynchronous power loss) and all data in the memory component is recovered. If the read is not successful, then a determination is made as to whether a data retention loss or asynchronous power loss has occurred. To make this determination, other pages in the data block that were written to before the last written page can be attempted to be read.

Also, other last written pages in vicinity to the last written page can be attempted to be read. In some instances, a certain number of data blocks are programmed at the same time, so the last written pages of the other data blocks that were programmed at the same time as the data block being examined can be scanned and checked with margin reads. To determine whether there is a data retention loss or was a power loss during programming, every data block of a superblock can be scanned using the conventional technique, which can incur processing delays to complete. Also, inaccurate determinations of data retention loss or asynchronous power loss can result by performing the margin reads if the offset is not properly configured, which can have an impact on performance of the memory sub-system by triggering folding or program continuation.

Aspects of the present disclosure address the above and other deficiencies by using a status indicator in a memory sub-system to detect an event. The status indicator can include a set of bytes that are not included in host data and that are inaccessible to systems lacking certain privileges and/or rights. The status indicator can be located (e.g., using a first offset) in a first distribution of levels after a first pass of a two-pass programming operation. The status indicator can be programmed/moved (e.g., using a second offset) to a highest level required by the particular type (e.g., QLC, TLC, MLC, etc.) of memory component upon completion of a second pass of the two-pass programming operation. Programming of the status indicator can indicate that writing of the data completed without a loss of power to the memory component. In some instances, when power loss occurs during writing of data to the memory component, the status indicator may not be programmed. Failure to program the status indicator can enable detection of the power loss occurring during programming of the data.

To detect an asynchronous power loss, in some embodiments, upon receiving an indication of an initialization of power to the memory component, the status indicator can be attempted to be read. For example, a last written page of open data blocks of the memory component can be identified. The last written page can be associated with the status indicator. For example, the last written page can be in the highest level of the required number of levels for the type of memory component. A determination can be made as to whether the status indicator can be read.

If the status indicator cannot be read, then it can be detected that programming of data to the open blocks of the memory component did not complete based on a power loss to the memory component. In response, program continuation can be used to recover a portion (e.g., not all) of the data programmed to one or more locations of the data block. The recovered portion can be written to a different part of the memory component or to another memory component (e.g., dynamic random access memory (DRAM)) of the memory sub-system. The portion of the data at the one or more locations of the data block can be invalidated, and the recovered portion can be written to the memory component at different locations. Thereafter, programming can continue at subsequent locations to the different locations in the data block.

If the status indicator can be read, then it can be determined that programming of the data to the data block completed. The data programmed in the data block can be read and if the data fails a bit error rate threshold, then a determination can be made that data retention loss has occurred. In response, folding can be used to read the data (e.g., all) programmed to the one or more data blocks at first locations in the one or more data blocks, program the data to second locations different than the first locations of the memory component, and invalidate the data at the first locations. For example, an entire superblock of data blocks can be rewritten to second locations.

Aspects of the present disclosure address the above and other deficiencies by reading the status indicator to detect whether a prior power loss occurred and avoiding the numerous scans and margin reads of the conventional technique when the prior power loss has been detected have to have occurred. As a result, the speed of making the determination as to whether a prior power loss has occurred or whether there is a data loss retention can be enhanced, thereby resulting in a faster boot-up time of the memory sub-system and less resources used. In addition, the accuracy of detecting a prior power loss and selecting to perform the associated handling procedures can be enhanced since the status indicator is written upon completion of programming of the data to the memory component of the memory sub-system (e.g., the only time the status indicator is not programmed is when power is lost prior to completion of programming of the data).

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a detection component 113 that can use a status indicator in the memory sub-system 110 to detect when a power loss has occurred during programming of data to the memory components 112A-112N. In some embodiments, the controller 115 includes at least a portion of the detection component 113. For example, the controller 115 can include a processor 117 (processing device) configured to execute instructions stored in local memory 119 for performing the operations described herein. In some embodiments, the detection component 113 is part of the host system 110, an application, or an operating system.

The detection component 113 can program the status indicator in a highest level of a required number of levels for a particular memory component type (e.g., QLC, TLC, MLC, etc.) upon a second pass of a two-pass programming operation completing. In some instances, the status indicator may not be programmed when power is lost to the memory component during programming of the data. At initialization, the detection component 113 can make a determination whether the status indicator can be read. If the status indicator can be read, the detection component 113 can determine that programming of the data completed without a prior loss of power. Further, the detection component 113 can determine whether data retention loss has occurred and perform folding to recover data. If the status indicator cannot be read, the detection component 113 can determine that programming of the data did not complete based on a prior loss of power to the memory component. As a result, the detection component 113 can perform program continuation to recover certain data. Further details with regards to the operations of the detection component 113 are described below.

Figure 2:
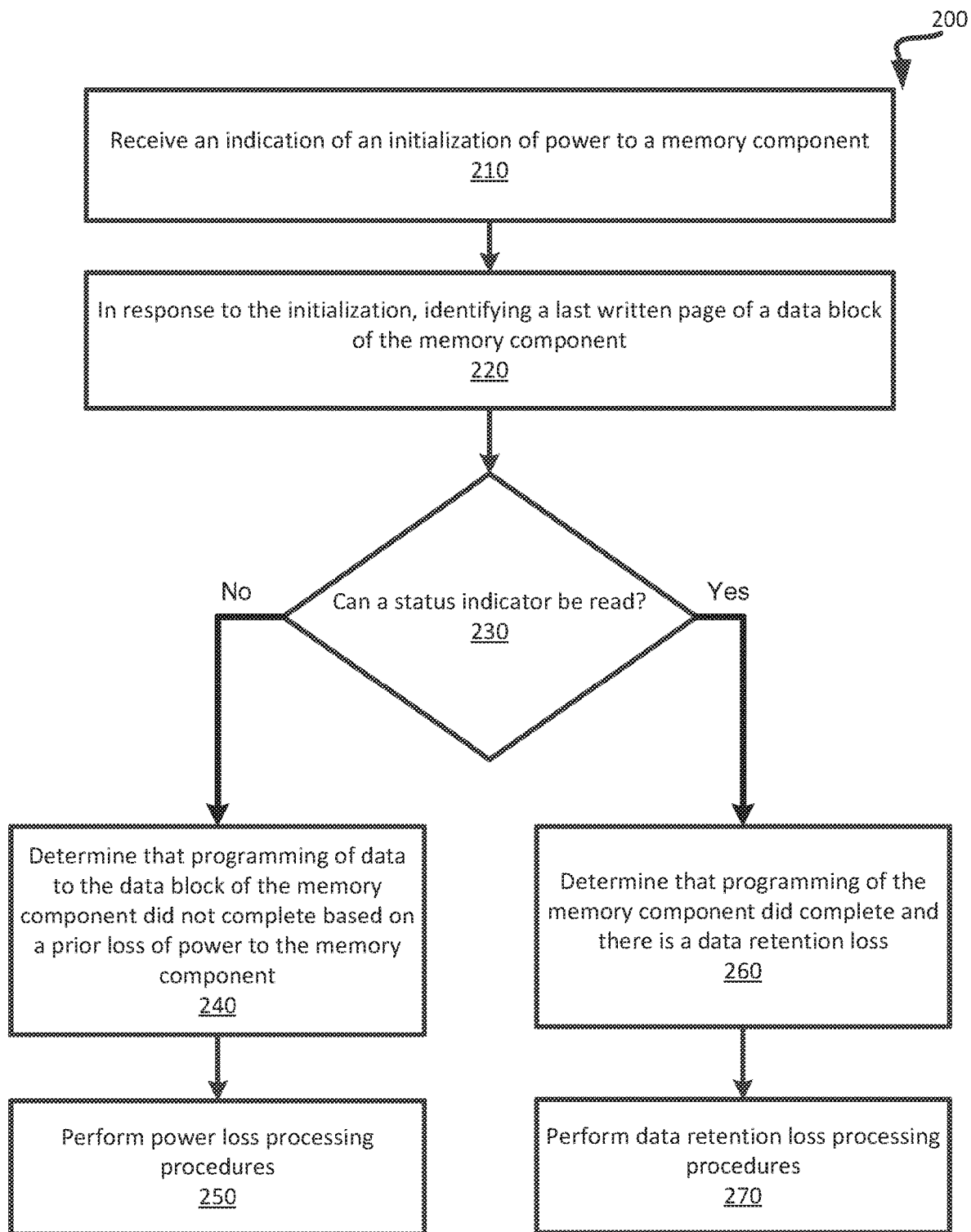
FIG. 2 is a flow diagram of an example method to determine that programming of data to a data block of a memory component did not complete based on a prior loss of power to the memory component in accordance with some embodiments of the present disclosure.

FIG. 2 is a flow diagram of an example method 200 to determine that programming of data to a data block of a memory component 112A did not complete based on a prior loss of power to the memory component 112A in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing device receives an indication of an initialization of power to a memory component 112A. The indication can be received upon first powering up the memory component 112A by the controller 115. In some embodiments, the remaining processes can be performed first during boot-up of the memory component 112A. Further, although just one memory component 112A is discussed, it should be understood that the processes can be applied for numerous memory components. For example, the processes can be applied to a superblock of data blocks spread across numerous memory components 112A-112N.

At block 220, the processing device, in response to the indication of the initialization, identifies a last written page of a data block of the memory component 112A. The last written page of the data block can be associated with the status indicator that enables detecting the occurrence of a prior power loss during programming of the data. In some embodiments, the processing device can identify a second status indicator that indicates which data blocks are open or closed. A data block is open when a two-pass programming operation has not completed on the data block. For example, the data block can be considered to be open when a first programming pass of the two-pass programming operation has been used to store data at the data block and a second programming pass of the two-pass programming operation has not yet been used to store data at the data block. As described further below with reference to FIG. 3 and the method 400 of FIG. 4, the status indicator can be programmed and associated with the last written page upon completion of the second pass of a two-pass programming operation of data to the memory component 112A. status indicator is not programmed and associated with the last written page when a power loss occurs during the two-pass programming operation of data. In some embodiments, the status indicator is moved from a first location to a second location of the data block of the memory component after the completion of the second pass. The second location may include a highest level required by the memory type (e.g., QLC, TLC, MLC) of the memory component 112A.

At block 230, the processing device determines whether the status indicator can be read. If the status indicator cannot be read, then at block 240, the processing device determines that programming of data to the data block did not complete based on a prior loss of power (e.g., asynchronous power loss) to the memory component 112A. Using the status indicator to detect a prior power loss can increase the boot-up time of the memory component 112A because it can be faster than scanning and performing margin reads on the data block.

At block 250, the processing device can perform power loss processing procedures (e.g., program continuation). Power loss processing procedures can refer to recovering a portion of data programmed to a data block and continuing to additional data to the data block. For example, the processing device can recover a portion of the data programmed to one or more locations of the data block. These one or more locations can include the last written page and one or more pages in the vicinity of the last written page. The other pages can be identified based on a programming sequence used for the particular type (e.g., QLC, TLC, MLC, etc.) of memory component 112A. For example, a page that was written immediately prior to the last written page, etc. can be considered to be in the vicinity of the last written page. The portion of the data can include less than all data that was previously programmed to the memory component 112A. The processing device can write the portion of the data to another memory component 112N (e.g., DRAM). Further, the processing device can invalidate the portion of the data at the one or more locations of the data block of the memory component 112A. The processing device can program one or more other locations of the data block with the portion of the data from the other memory component 112N.

After programming the portion of the data back to the memory component 112A, the processing device can use a system table that tracks which page would have been written to next had programming continued to store additional data to the memory component 112A. That is, the processing device can continue writing data at an immediately subsequent location to the other locations where the portion of the data was written. The system table can be updated during initialization of the memory component 112A.

If the status indicator can be read, at block 260, the processing device determines that programming of the memory component 112A completed and there is a data retention loss. A scan of the data of the memory component 112A can be performed as a background process and the data can be analyzed. If the data stored on the memory component 112A does not satisfy the criteria for a data retention loss, then the processing device can determine that there is not a data retention loss. The criteria may include exceeding a threshold for a bit error rate and/or failing to read the data.

At block 260, in response to determining that programming of the memory component 112A did complete and there is a data retention loss, the processing device can perform data retention loss procedures (e.g., folding). Data retention loss procedures can refer to programming every data stored at first locations of a data block to second locations in the data block (e.g., if a data block includes data stored in twenty cells, programming every data in the twenty cells to twenty different cells) and invalidating the data at the first locations. The data retention loss procedures can include reading the data programmed to the data block. The processing device can program the data to second locations that are different than the first locations of the memory component 112A. In some instances, this can include reading data in each data block of a superblock one by one and rewriting the respective data to different locations within the respective data block. The second locations can be locations subsequent to the first locations in the data block. Further, the processing device can invalidate the data at the first locations.

Figure 3:
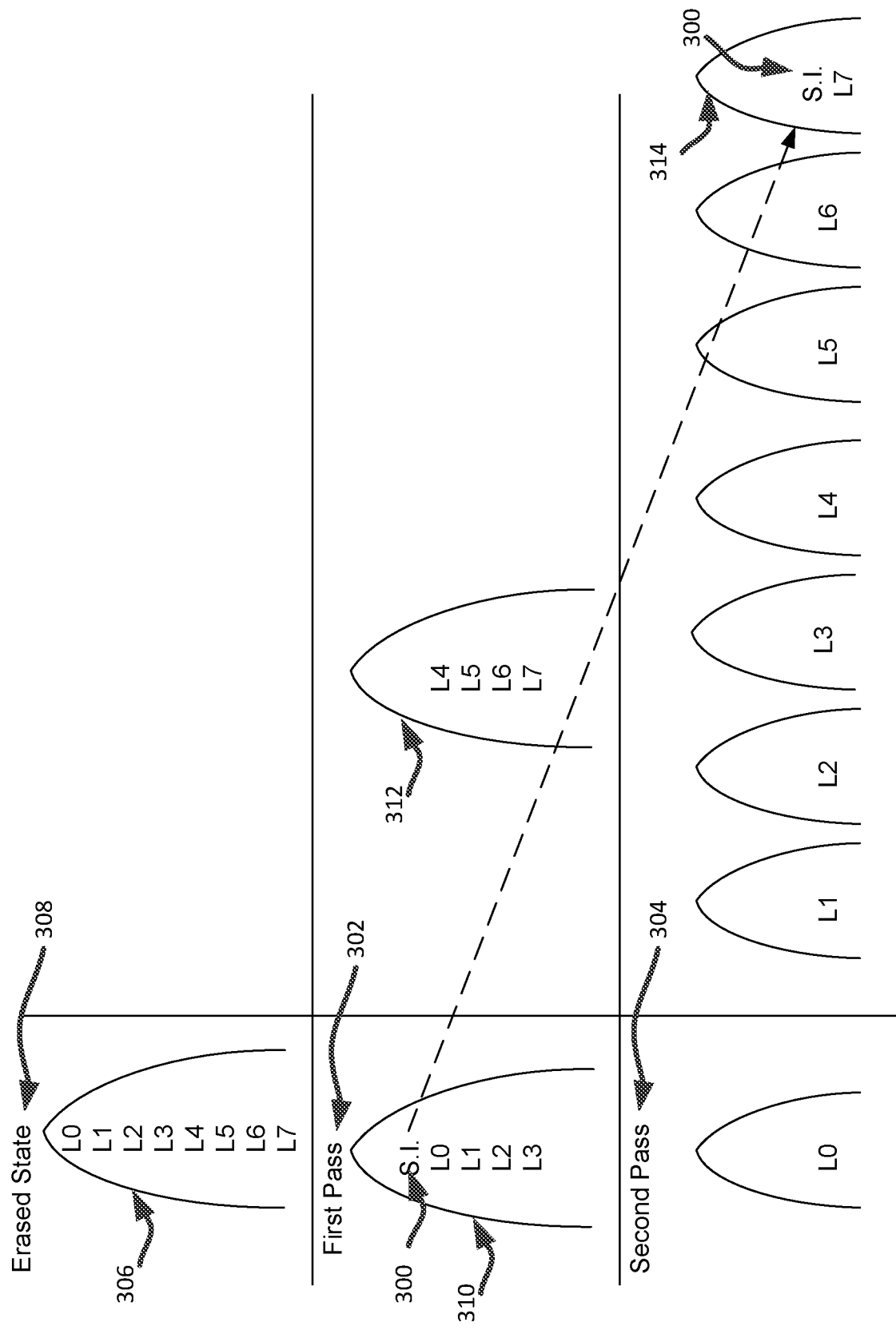
FIG. 3 illustrates an example of programming a status indicator upon completion of data programming to a data block of a memory component in accordance with some embodiments of the present disclosure.

FIG. 3 illustrates an example of programming a status indicator 300 upon completion of data programming to a data block of a memory component 112A in accordance with some embodiments of the present disclosure. In some embodiments, the status indicator is programmed by the detection component 113 of FIG. 1. The depicted example includes a memory component having a memory type of TLC. Thus, there are three pages (e.g., LP, UP, XP) per memory cell and there are eight required levels (e.g., L0, L1, L2, L3, L4, L5, L6, L7) for TLC. However, it should be understood that similar techniques can be applied to any other type of memory (e.g., QLC, MLC, etc.). Also, the depicted example depicts a two-pass programming operation where half of the data is programmed to the data block after a first pass 302, and the other half of the data is programmed to the data block after the second pass 304. Similar techniques can be applied to any other type of programming operation.

The status indicator can include one or more bytes (e.g., 4 bytes, eight bytes, etc.) that are not accessible in a normal operation mode. To access the status indicator, a certain mode (e.g., administrator) or command can be used to program the status indicator upon completion of a two-pass programming operation. The status indicator can be located in a range of memory outside of a range of memory reserved for host data that is accessed by a host system.

Prior to programming data to the data block, the levels L0, L1, L2, L3, L4, L5, L6, L7 included in a distribution 306 are in an erased state 308. After the first pass 302 completes, there can be two distributions (e.g., voltage distributions) of levels 310 and 312. The distribution 310 that includes L0, L1, L2, and L3 can include data that represents a logical "1" and the distribution 312 that includes L4, L5, L6, and L7 can include data that represents a logical "0". The status indicator 300 can be programmed with an offset to be included in the distribution 310. The first pass 302 can program the LP in the data block of the memory component 112A having type TLC.

After completing the second pass 304, there can be additional distributions of levels that are programmed with the remaining data. The UP and XP can be programmed in the second pass 304. As depicted, the status indicator 300 has been moved to a highest level L7 in distribution 314. The status indicator 300 can be located in the highest level L7 and is associated with the last written page by programming the status indicator 300 with an offset representing the highest level L7. The status indicator 300 can be programmed at the highest level L7 after data programming is completed in the second pass 304 to ensure that programming completed without a power loss.

Figure 4:
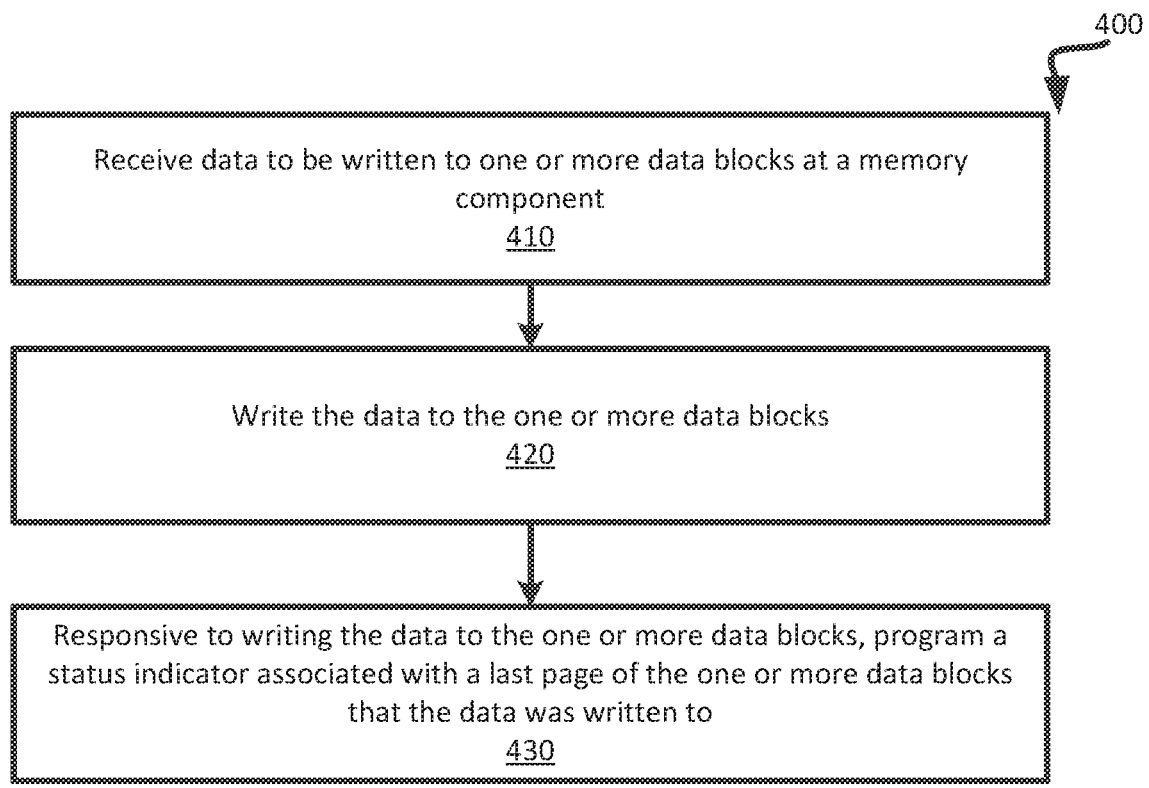
FIG. 4 is a flow diagram of an example method to program a status indicator upon completion of data programming to a data block of a memory component in accordance with some embodiments of the present disclosure.

FIG. 4 is a flow diagram of an example method 400 to program a status indicator upon completion of data programming to a data block of a memory component 112A in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the processing device receives data to be written to one or more data blocks at the memory component 112A. The data can be received from the host system 120. The number of blocks to which the data is written can depend on the type of memory component being used.

At block 420, the processing device writes the data to the one or more blocks. As described above, a two-pass programming operation can be used where a portion (e.g., half) of the data is programmed to a subset of the one or more data blocks in the first pass and the remaining portion (e.g., other half) of the data is programmed to a remaining subset of the one or more blocks in the second pass. For example, for TLC memory, a programming sequence may specify programming half of the data to the LP in the first pass and to the UP and XP in the second pass.

At block 430, the processing device, responsive to writing the data to the one or more blocks, programs a status indicator 300 associated with a last page of the one or more data blocks to which the data was written. The status indicator 300 can indicate that the writing of the data completed without a loss of power to the memory component 112A. The status indicator 300 can be programmed after completion of the second pass 304 of the two-pass programming operation and can be programmed at a new location (e.g., a highest level required for the type of memory component 112A) of the memory component 112A. The status indicator 300 can be associated with a last written page of the one or more data blocks. If there is a power loss prior to completion of the two-pass programming operation of the memory component 112A, then the status indicator 300 is not programmed.

After completing programming of the data, the memory component 112A can be powered down. Upon receiving an indication of an initialization of power to the memory component 112A, the processing device can determine whether the status indicator 300 can be read. If so, the processing device can determine that there was not an asynchronous power loss during programming of the data to the one or more data blocks. In some embodiments, the processing device can determine that there is a data retention loss and perform data retention loss processing procedures (e.g., folding). If the status indicator 300 cannot be read, then the processing device can determine that programming did not complete due to a prior power loss and can perform power loss processing procedures (e.g., program continuation).

Figure 5:
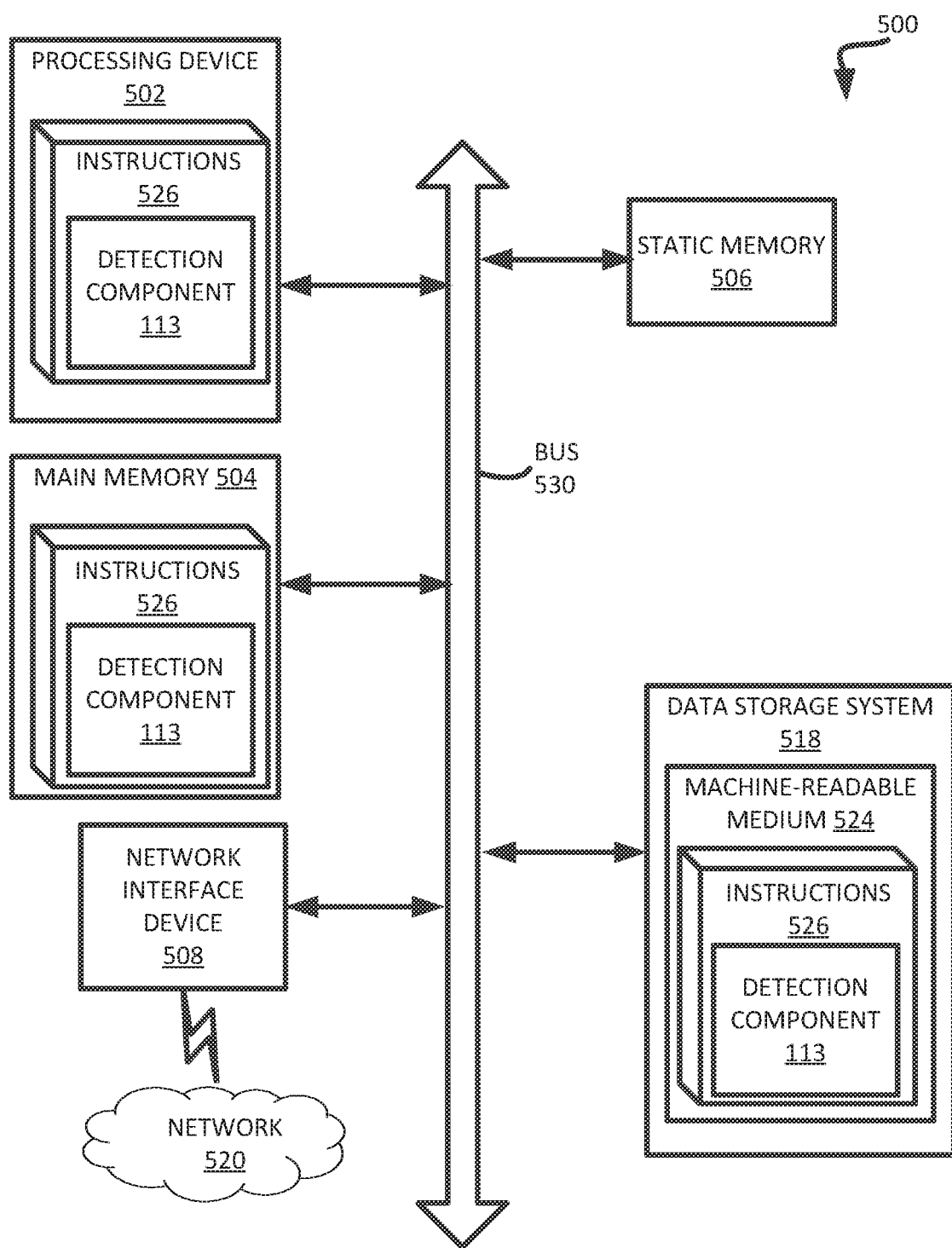
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the detection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a detection component (e.g., the detection component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving an indication of an initialization of power to a memory component;
   in response to receiving the indication of the initialization, identifying a last written page of a data block of the memory component, wherein the last written page is associated with a status indicator;
   determining whether the status indicator is readable; and
   responsive to determining that the status indicator is readable, determining that programming of data to the data block of the memory component did complete and there is a data retention loss.

2. The method of claim 1, further comprising:
   responsive to determining that the status indicator is readable, determining that there was not an asynchronous power loss during programming of the data to the one or more data blocks.

3. The method of claim 1, further comprising, responsive to determining that programming of the memory component did complete and there is a data retention loss:
   reading the data programmed to the data block, the data being at first locations of the memory component;
   programming the data to second locations different than the first locations of the memory component; and
   invalidating the data at the first locations.

4. The method of claim 1, wherein the status indicator is moved from a first location to a second location of the data block of the memory component after a second pass of a two-pass programming operation of the data completes.

5. The method of claim 1, further comprising:
   responsive to determining that the status indicator is not readable, determining that programming of data to the data block of the memory component did not complete based on a prior loss of power to the memory component.

6. The method of claim 5, further comprising, responsive to determining that the programming of the data to the data block of the memory component did not complete based on the prior loss of power to the memory component:
   recovering a portion of the data programmed to one or more locations of the data block;
   invalidating the portion of the data at the one or more locations of the data block; and
   programming one or more other locations of the data block with the portion of the data.

7. The method of claim 5, wherein the prior loss of power is an asynchronous power loss of the memory component.

8. The method of claim 5, wherein identifying the last written page of the data block of the memory component further comprises:
   identifying that the data block is open based on a second status indicator, wherein the data block is open when a two-pass programming operation has not completed on the data block.

9. A system comprising:
   a plurality of memory components; and
   a processing device, operatively coupled with the plurality of memory components, to perform operations comprising:
   receiving an indication of an initialization of power to a memory component;
   in response to receiving the indication of the initialization, identifying a last written page of a data block of the memory component, wherein the last written page is associated with a status indicator;
   determining whether the status indicator is readable; and
   responsive to determining that the status indicator is readable, determining that programming of data to the data block of the memory component did complete and there is a data retention loss.

10. The system of claim 9, wherein the operations further comprise:
    responsive to determining that the status indicator is readable, determining that there was not an asynchronous power loss during programming of the data to the one or more data blocks.

11. The system of claim 9, wherein the operations further comprise, responsive to determining that programming of the memory component did complete and there is a data retention loss:
    reading the data programmed to the data block, the data being at first locations of the memory component;
    programming the data to second locations different than the first locations of the memory component; and
    invalidating the data at the first locations.

12. The system of claim 9, wherein the status indicator is moved from a first location to a second location of the data block of the memory component after a second pass of a two-pass programming operation of the data completes.

13. The system of claim 9, wherein the operations further comprise:

responsive to determining that the status indicator is not readable, determining that programming of data to the data block of the memory component did not complete based on a prior loss of power to the memory component.

14. The system of claim 13, wherein the operations further comprise, responsive to determining that the programming of the data to the data block of the memory component did not complete based on the prior loss of power to the memory component:
   recovering a portion of the data programmed to one or more locations of the data block;
   invalidating the portion of the data at the one or more locations of the data block; and
   programming one or more other locations of the data block with the portion of the data.

15. The system of claim 13, wherein the prior loss of power is an asynchronous power loss of the memory component.

16. The system of claim 13, wherein identifying the last written page of the data block of the memory component further comprises:
   identifying that the data block is open based on a second status indicator, wherein the data block is open when a two-pass programming operation has not completed on the data block.

17. A non-transitory computer-readable storage medium comprising instructions that, when executed by a processing device, cause the processing device to:
   receive data to be written to one or more data blocks at a memory component;
   write the data to the one or more data blocks; and
   program a status indicator associated with a last page of the one or more data blocks that the data was written to, wherein the status indicator indicates that the writing of the data did not complete based on a prior loss of power to the memory component.

18. The computer-readable storage medium of claim 17, wherein the processing device is further to, upon receiving an indication of an initialization of power to the memory component:
   determine whether the status indicator is readable; and
   responsive to determining that the status indicator is not readable, determine that there was an asynchronous power loss during programming of the data to the one or more data blocks.

19. The computer-readable storage medium of claim 18, wherein the processing device is further to:
   recover a portion of the data written to one or more locations of the data block;
   invalidate the portion of the data at the one or more locations of the data block; and
   write the portion of the data to one or more other locations of the data block.

20. The computer-readable storage medium of claim 17, wherein to write the data to the one or more blocks, the processing device is further to:
   write a portion of the data to a subset of the one or more data blocks in a first pass of a two-pass programming operation;
   write remaining portions of the data to a remaining subset of the one or more data blocks in a second pass of the two-pass programming operation; and
   program the status indicator at a new location of the one or more data blocks.

* * * * *